US007710610B2

(12) United States Patent
Katagiri et al.

(10) Patent No.: US 7,710,610 B2
(45) Date of Patent: May 4, 2010

(54) IMAGE FORMING APPARATUS EMPLOYING A FORGERY DISCRIMINATION PATTERN

(75) Inventors: Shinji Katagiri, Shizuoka (JP); Yoichiro Maebashi, Tokyo (JP)

(73) Assignee: Canon Kabushiki Kaisha, Tokyo (JP)

(*) Notice: Subject to any disclaimer, the term of this patent is extended or adjusted under 35 U.S.C. 154(b) by 1000 days.

(21) Appl. No.: 10/922,954

(22) Filed: Aug. 23, 2004

(65) Prior Publication Data

US 2005/0046691 A1 Mar. 3, 2005

(30) Foreign Application Priority Data

Aug. 29, 2003 (JP) ............................ 2003-307184

(51) Int. Cl.
*H04N 1/40* (2006.01)
*G03F 3/08* (2006.01)

(52) U.S. Cl. ....................... 358/3.28; 358/1.9; 358/504; 358/515; 358/518; 358/521; 347/19; 399/39; 382/162; 382/167; 283/113; 283/114

(58) Field of Classification Search ................... 347/11, 347/116; 356/402, 419, 425; 358/1.9, 3.1, 358/3.26, 518, 519, 520, 521, 527, 530, 537, 358/3.27, 3.28; 382/167; 399/301
See application file for complete search history.

(56) References Cited

U.S. PATENT DOCUMENTS

| | | | | |
|---|---|---|---|---|
| 4,965,697 | A * | 10/1990 | Mosser et al. | 361/283.1 |
| 5,557,412 | A | 9/1996 | Saito et al. | |
| 5,604,567 | A * | 2/1997 | Dundas et al. | 399/39 |
| 5,748,221 | A * | 5/1998 | Castelli et al. | 347/232 |
| 5,822,660 | A * | 10/1998 | Wen | 399/194 |
| 5,878,162 | A * | 3/1999 | Miyazaki et al. | 382/162 |
| 6,091,922 | A | 7/2000 | Bisaiji | 399/297 |
| 6,094,502 | A * | 7/2000 | Hirata et al. | 382/167 |
| 6,148,158 | A * | 11/2000 | Amemiya | 399/39 |
| 6,226,466 | B1 * | 5/2001 | Ojima et al. | 399/49 |
| 6,256,110 | B1 * | 7/2001 | Yoshitani | 358/1.9 |
| 6,259,879 | B1 | 7/2001 | Bisaiji | 399/296 |
| 6,320,675 | B1 | 11/2001 | Sakaki et al. | 358/1.9 |
| 6,384,918 | B1 * | 5/2002 | Hubble et al. | 356/402 |
| 6,384,934 | B1 * | 5/2002 | Kohtani et al. | 358/1.9 |

(Continued)

FOREIGN PATENT DOCUMENTS

| | | |
|---|---|---|
| JP | 11-41445 A | 2/1999 |

(Continued)

*Primary Examiner*—King Y Poon
*Assistant Examiner*—Richard Z Zhu
(74) *Attorney, Agent, or Firm*—Fitzpatrick, Cella, Harper & Scinto

(57) ABSTRACT

An image forming apparatus includes an image forming unit adapted to form images of a plurality of colors in a manner in which a predetermined pattern of a predetermined color is registered thereon and superimpose those images to form a color image, a controller configured to control the image forming unit so as to form a patch image of each color for density detection, and a detector configured to detect the density of each of the patch images. The controller controls the image forming unit so as to superimpose the predetermined pattern of the predetermined color upon the patch image of a predetermined color and not to superimpose the predetermined pattern of the predetermined color upon the patch images of the other colors.

4 Claims, 9 Drawing Sheets

U.S. PATENT DOCUMENTS 6,411,402 B1 6/2002 Sakaki et al. ................ 358/1.9
6,434,354 B2 8/2002 Bisaiji ........................ 399/296
6,445,467 B1 9/2002 Sakaki et al. ................ 358/1.9
6,538,768 B2 * 3/2003 Shibahara et al. ............ 358/1.9
6,553,192 B2 4/2003 Maebashi .................... 399/50
6,721,067 B2 4/2004 Sakaki et al. ................ 358/1.9
6,912,295 B2 * 6/2005 Reed et al. .................. 382/100
7,002,710 B1 * 2/2006 Van Liew et al. .......... 358/3.28
7,027,189 B2 * 4/2006 Umeda ...................... 358/3.03
7,027,614 B2 * 4/2006 Reed .......................... 382/100
7,058,198 B1 * 6/2006 Miyashita ................... 382/100
7,196,804 B2 * 3/2007 Yamazaki et al. .......... 358/1.15
7,345,798 B2 * 3/2008 Kondo ........................ 358/523
2001/0007616 A1 7/2001 Bisaiji ........................ 399/296
2001/0028471 A1 * 10/2001 Hirokazu ................... 358/1.13
2002/0126316 A1 9/2002 Sakaki et al. .............. 358/3.28
2003/0112470 A1 6/2003 Sakaki et al. .............. 358/3.28
2003/0138261 A1 7/2003 Tezuka et al. ................. 399/49

FOREIGN PATENT DOCUMENTS

JP 11-52758 A 2/1999
JP 6-113109 4/2004

* cited by examiner

IMAGE FORMING APPARATUS EMPLOYING A FORGERY DISCRIMINATION PATTERN

BACKGROUND OF THE INVENTION

1. Field of the Invention

This invention relates to an image forming apparatus such as a copying machine or a printer for transferring a toner image formed on an image bearing member, for example, by an electrophotographic process to a recording material, and thereafter fixing the toner image to thereby obtain a permanent image on the recording material.

2. Description of Related Art

As a color image forming apparatus capable of outputting a full-color image, there has heretofore been put into practical use one having a construction in which at a first transferring region, formed in the portion of contact between the surface of an image bearing member and the surface of a transfer material carrying member, a first transferring bias is applied to a first transfer member disposed on the back of the transfer material carrying member to thereby once transfer, i.e., primary-transfer, a toner image on the surface of the image bearing member to the surface of the transfer material carrying member. Then, the transfer material is passed to a second transferring region, formed in the portion of contact between the transfer material carrying member and a second transfer member, and a second transferring bias is applied to thereby again transfer, i.e., secondary-transfer, the toner image on the surface of the transfer material carrying member to the transfer material.

In the above-described image forming apparatus, color reproduction is effected with toners of four colors, i.e., yellow, cyan, magenta and black, superimposed one upon another. Therefore, unless the density of the toner images of the four colors is accurately adjusted, good color balance cannot be obtained.

Accordingly, in many color image forming apparatuses, there is carried an image density control mechanism for automatically adjusting image forming conditions such as charging potential, an exposure amount and a developing bias. A popular method for this image density control is as follows.

First, a predetermined image for density control (hereinafter referred to as the patch) is formed on the image bearing member or the transfer material carrying member, and the density of the toner image is detected by an optical sensor (density sensor) comprising a light emitting element and a light receiving element. The image forming conditions are then adjusted in conformity with the detected density of the toner image.

FIG. 2 of the accompanying drawings is an example of a schematic view of the above-mentioned patch for density detection. In FIG. 2, Y1-Y4 are test patches for detection when a developing bias for yellow was set to four stages, i.e., −100V, −150V, −200V and −250V, and density was changed. Each of these patches is of a size of 2 cm square. Likewise, M1-M4 are test patches for the detection of magenta, C1-C4 are test patches for the detection of cyan, and K1-K4 are test patches for the detection of black. The patches for density detection are formed so as not to overlap one another, and the arrow in FIG. 2 indicates the direction of movement on the image bearing member or the transfer material carrying member.

Discretely from the above-described density detection, in such an image forming apparatus, in order to further improve the quality of the final image, a minute toner image of a dot-type (a shock band preventing pattern) formed by a yellow toner or the like can be additionally formed on the image bearing member, besides a toner image of an image pattern desired by a user (see, for example, Japanese Patent Application Laid-Open No. H11-052758).

This is because when a toner image formed on the surface of the image bearing member is primary transferred to the surface of the transfer material carrying member (intermediate transfer belt), a minute fluctuation of rotation sometimes occurs to the image bearing member and this may cause uneven exposure to a laser beam. In such a case, an image streak occurs to a toner image subsequently formed on the surface of the image bearing member. In order to prevent the occurrence of such an image streak, the minute toner image is formed.

A dot toner image pattern of an arrangement shown, for example, in FIGS. 3 and 4 of the accompanying drawings is formed as a dot toner image pattern. A box in these figures represents 600 dpi, and the data of pixels indicated by black in the figures is defined as FFh, whereby a minute dot toner image is formed at the relevant position.

The dot toner image pattern shown in FIG. 3 comprises dot toner images of the size of a pixel arranged at intervals of 0.46 mm in each of a main scanning direction (the rotational direction of the image bearing member) and a sub-scanning direction (the rotational direction of the transfer material carrying member).

Also, FIG. 4 shows dot toner images of the same size arranged at an oblique angle of 45° with respect to the main scanning direction, and the dot interval in the sub-scanning direction is 0.34 mm. The toner image by any one of these patterns is formed in overlapping relationship with the entire area of a toner image of an image pattern desired by the user.

The average printing rate when such a dot toner image is formed on a photosensitive drum as the image bearing member differs in its appropriate value from one image forming apparatus to another, depending on the contacting force of a primary transfer roller with the photosensitive drum, the difference in surface peripheral speed between the photosensitive drum and the intermediate transfer belt as the transfer material carrying member, etc. But, in such an image forming apparatus, design is made such that the printing rate is of the order of 0.05-1% relative to the toner printing rate of a solid image portion of each color on the photosensitive drum. This is because when the printing rate is too low, the fluctuation of the rotation of the photosensitive drum cannot be suppressed, and when the printing rate is too high, a level which can be visually confirmed by the user results.

Further, a conventional image forming apparatus has the feature that there is formed a pattern (a forgery discriminating pattern) representative of the follow-up information of the image forming apparatus such as, for example, the manufacturing number, manufacturer and date of manufacture of the image forming apparatus (see, for example, Japanese Patent Application Laid-Open No. H11-41445).

According to such a construction, the aforementioned image streak can be prevented. On the other hand, when a bill, a negotiable instrument or the like has been forged by the use of an image forming apparatus, the dot size or arrangement of dot toner images formed on the forged matter can be researched to thereby specify the image forming apparatus. In such a manner, it becomes possible to obviate the forgery of a bill, a negotiable instrument or the like.

FIG. 5 of the accompanying drawings shows an example of the pattern of the dot toner images. A box in the figure represents 600 dpi, and the data of pixels indicated by black in the figure is defined as FFh, whereby a minute dot toner image is formed at the relevant position. In this pattern, a dot toner image of a size of 1 pixel (main scanning direction)×4 pixels (sub-scanning direction) forms a pattern representative of the follow-up information of the image forming apparatus. Also, this dot toner image is formed in overlapping relationship with the entire area of a toner image of an image pattern on a bill, a negotiable instrument or the like.

However, the final image obtained by the above-described image forming apparatus causes the following inconvenience of image density.

In the above-described conventional image forming apparatus, when density control is effected, the above-mentioned shock band preventing pattern or forgery discriminating pattern is not superposed on each of the yellow, magenta, cyan and black patches. On the other hand, when an actual image is formed, the image is formed with a pattern superposed thereon and therefore, image density has sometimes been fluctuated. The cause of the problem of this fluctuation of image density will hereinafter be described.

The above-mentioned shock band preventing pattern and forgery discriminating pattern generally use the yellow color, and if the above-described pattern is imprinted on the entire surface, it is difficult to see by the human eyes, but it affects the density of an actual toner image (the density becomes high), and particularly in a high light portion (low density portion), noise and the yellowishness of the texture become conspicuous. Also, the above-described pattern is singly difficult to see, but it will sometimes be visualized if it is mixed with a toner of other color by subtractive color mixture.

Even if in order to obtain an optimum quality of image, the above-described density control is effected to thereby correct image density, the above-described shock band preventing pattern and forgery discriminating pattern overlap the actual toner image over the entire area thereof. If at this time, the toner density is high, there is little or no contribution by the above-described pattern overlapping the actual toner image. But, when the toner density is low, that is, in the high light portion, the contribution of the above-described pattern becomes great, and the difference between the density obtained by the result of the density control and the density of the actual toner image is remarkably seen.

SUMMARY OF THE INVENTION

The prevent invention has been made in order to eliminate the above-noted disadvantages peculiar to the prior art and an object thereof is to provide an image forming apparatus which can prevent the fluctuation of image density to thereby improve the accuracy of density control and stably obtain a final image of a high quality even when a predetermined pattern is added.

Another object of the present invention is to provide an image forming apparatus including an image forming portion (e.g., image forming unit) adapted to form images of a plurality of colors in a manner in which a predetermined pattern of a predetermined color is registered thereon, and register those images one upon another to thereby form a color image. The image forming apparatus also includes a controller configured to control the image forming unit so as to form a patch image of each color for density detection, and a detector configured to detect the density of each of the patch images. The controller controls the image forming unit so as to register the predetermined pattern of the predetermined color upon the patch images.

Another object of the present invention is to provide an image forming apparatus including an image forming portion adapted to form images of a plurality of colors in a manner in which a predetermined pattern of a predetermined color is registered thereon, and register those images one upon another to thereby form a color image. The image forming apparatus also includes a controller configured to control the image forming unit so as to form a patch image of each color for density detection, a detector configured to detect the density of each of the patch images, and a unit for adjusting an image forming condition of the predetermined color on the basis of the result of the detection by the detector and the density of the predetermined pattern.

Another object of the present invention is to provide a controlling method for an image forming apparatus for forming images of a plurality of colors in a manner in which a predetermined pattern of a predetermined color is superimposed thereon, and superimposing those images one upon another to thereby form a color image. The method includes a step of controlling an image forming unit so as to form a patch image of each color for density detection, and a step of detecting the density of each of the patch images. In the controlling step, the image forming unit is controlled so that the predetermined pattern of the predetermined color may be registered upon the patch image of the predetermined color and the predetermined pattern of the predetermined color may not be registered upon the patch images of the other colors.

wherein at the controlling step, the image forming unit is controlled so that the predetermined pattern of the predetermined color may be registered upon the patch image of the predetermined color and the predetermined pattern of the predetermined color may not be registered upon the patch images of the other colors.

Another object of the present invention is to provide a controlling method for an image forming apparatus for forming images of a plurality of colors in a manner in which a predetermined pattern of a predetermined color is superimposed thereon, and registering those images one upon another to thereby form a color image. The method includes a step of controlling an image forming unit so as to form a patch image of each color for density detection, and a step of detecting the density of each of the patch images. In the controlling step, the image forming portion is controlled so that the predetermined pattern of the predetermined color may be registered upon the patch images.

Another object of the present invention is to provide a controlling method for an image forming apparatus for forming images of a plurality of colors in a manner in which a predetermined pattern of a predetermined color is superimposed thereon, and superimposing those images one upon another to thereby form a color image. The method includes a step of controlling an image forming unit so as to form a patch image of each color for density detection, a step of detecting the density of each of the patch images, a step of adjusting an image forming condition of the predetermined color on the basis of the result of detection at the detecting step, and the density of the predetermined pattern.

According to the present invention, even when a predetermined pattern is added, the fluctuation of image density can be prevented and the accuracy of density control can be improved to thereby stably obtain a final image of a high quality.

Other objects, constructions and effects of the present invention will become apparent from the following detailed description and the accompanying drawings.

DETAILED DESCRIPTION OF THE PREFERRED EMBODIMENTS

Some preferred embodiments of the present invention will hereinafter be described in detail by way of example with reference to the drawings. However, the dimensions, materials, shapes, relative disposition, etc. of constituent parts described in these embodiments, unless particularly specified, are not intended to restrict the scope of the present invention thereto.

Also, in the following description, an "actual toner image" refers to a toner image formed to print desired image data except during density control, and a "pattern" refers to a shock band preventing pattern and/or a forgery discriminating pattern.

First Embodiment

The present invention can be embodied into an image forming apparatus such as a printer or a copying machine of an electrophotographic type.

Figure 1:
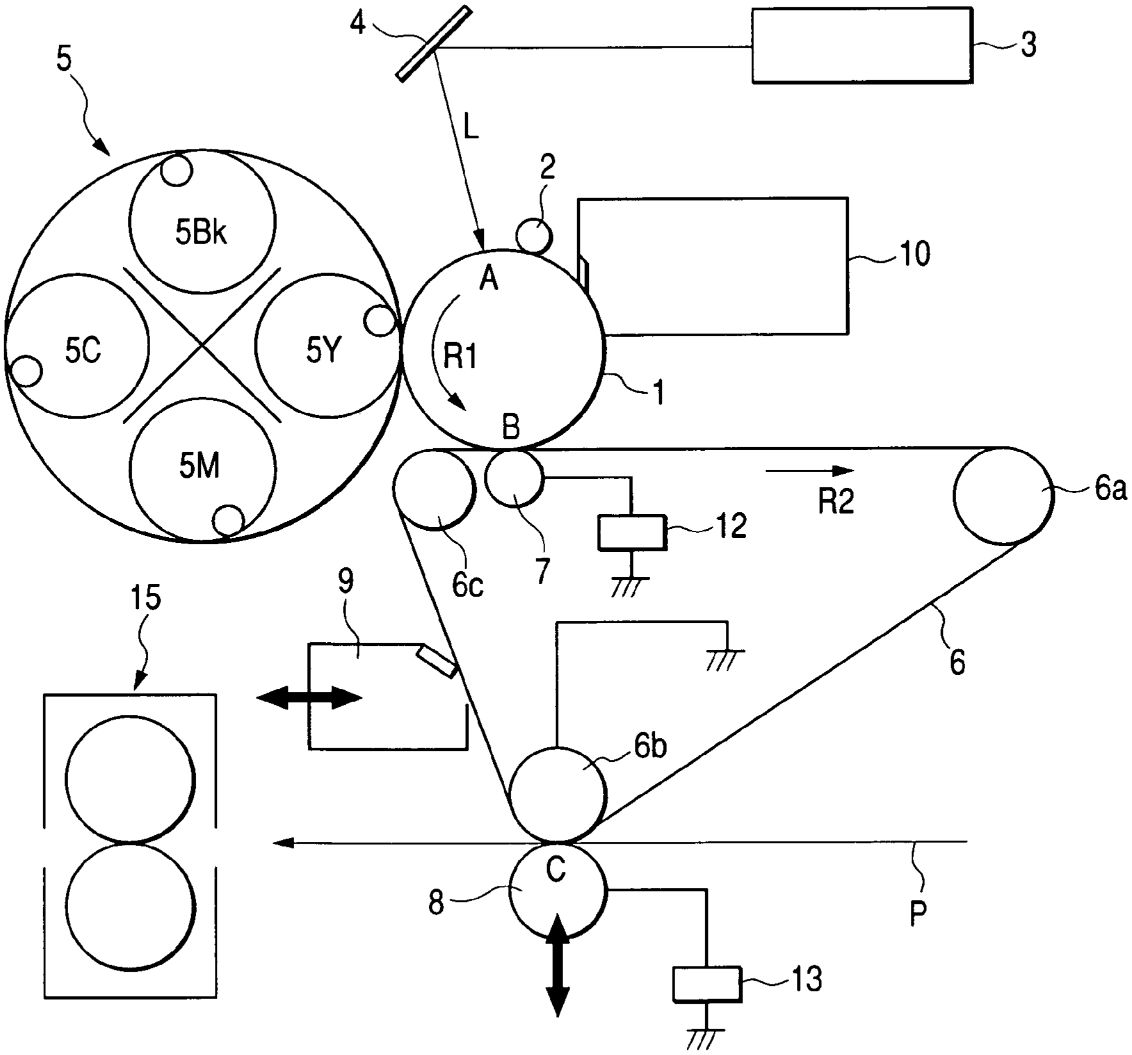
FIG. 1 shows an example of the construction of an image forming apparatus corresponding to an embodiment of the present invention.

FIG. 1 shows an example of the construction of the color image forming apparatus of the present invention corresponding to the present embodiment. In the image forming apparatus corresponding to the present embodiment, image exposure L by a laser beam is given from an exposing apparatus 3 through the intermediary of a reflecting mirror 4 onto a photosensitive drum 1, which is a rotary drum-shaped electrophotographic photosensitive member as an image bearing member rotated in the direction of arrow R1 and uniformly charged by a charging device 2. In this manner, an electrostatic latent image corresponding to a desired color image is formed at an exposing region A.

Then, this formed electrostatic latent image is developed by developing devices 5 (a yellow developing device 5Y, a magenta developing device 5M, a cyan developing device 5C and a black developing device 5Bk), whereby a yellow toner image, a magenta toner image, a cyan toner image and a black toner image are formed on the photosensitive drum 1. The yellow toner image, the magenta toner image, the cyan toner image and the black toner image are successively superimposed and primary-transferred onto the surface of an intermediate transfer belt 6 as a transfer material carrying member at a primary transferring nip part B between a primary transfer roller 7 and the photosensitive drum 1, which is a primary transferring region, while the intermediate transfer belt 6 makes four rounds in the direction of arrow R2. The full-color toner image superimposed on the intermediate transfer belt 6 is collectively secondary-transferred as a full-color toner image corresponding to the desired color image to a transfer material P fed to a secondary transferring nip part C between a secondary transfer roller 8 and a secondary transfer opposed roller 6*b*, which is a secondary transferring region. The transfer material P to which the secondary transfer has been finished is conveyed to a fixing device 15, after which it is pressurized and heated and the toners of the four colors are fused and mixed together and are fixed on the transfer material P. Thus, a final full-color image is formed on the transfer material P.

The intermediate transfer belt 6 is passed over a drive roller 6*a*, a secondary transfer opposed roller 6*b* and a tension roller 6*c*. The drive roller 6*a* rotated in the direction of R2 by the rotative driving of the drive roller 6*a* is provided with a surface layer of a rubber material on the mandrel thereof. Also, as the intermediate transfer belt 6, use is made of a seamless belt made of resin or rubber. In such an image forming apparatus, a direction in which the laser beam is scanned is called a main scanning direction, and the directions R1 and R2 in which the photosensitive drum 1 and the intermediate transfer belt 6 are rotated are called a sub-scanning direction.

Description will now be made of the above-mentioned primary and secondary transferring steps. If the photosensitive drum 1 is, for example, an OPC photosensitive member of the negative polarity, when an exposed portion on the photosensitive drum 1 subjected to the image exposure L is to be developed by the developing devices 5 (the yellow developing device 5Y, the magenta developing device 5M, the cyan developing device 5C and the black developing device 5Bk), toners of the negative polarity are used. Accordingly, a transferring bias of the positive polarity is applied from a transferring voltage source 12 to the primary transfer roller 7. In the secondary transfer by the secondary transfer roller 8, the secondary transfer opposed roller 6*b* of which the back is grounded or has a suitable bias applied thereto is used as an opposed electrode, and a positive polarity bias is applied from a high voltage source 13 to the secondary transfer roller 8, which is brought into contact with the transfer material P from the back side thereof.

Image forming conditions such as the exposure amount, the developing bias and the transferring bias in the foregoing are conditions directly related to the density of the toner images, and are set on the basis of density control which will be described later.

When the above-described process is completed, any toners remaining on the intermediate transfer belt 6 after the secondary transfer are removed by an intermediate transfer belt cleaning apparatus 9. Also, any residual toners on the photosensitive drum 1 after the termination of the primary transfer are collected by a cleaner 10, and the photosensitive drum 1 becomes ready for the next cycle.

Figure 11:
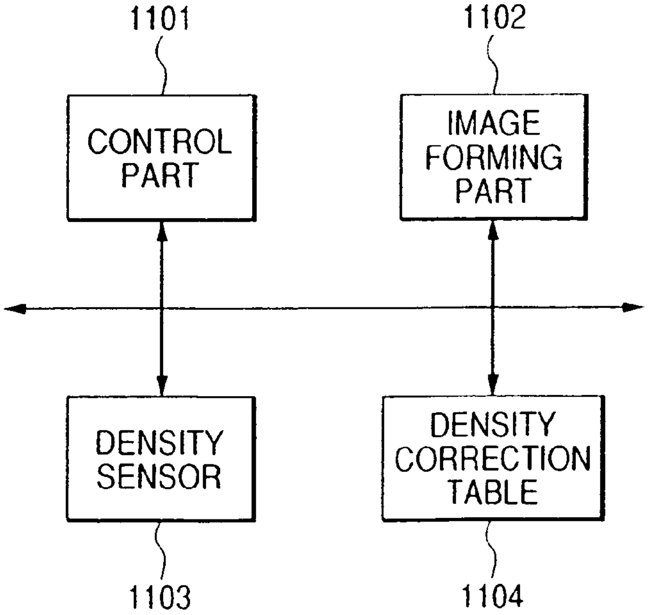
FIG. 11 shows examples of the constituents of the image forming apparatus corresponding to the embodiment of the present invention.

Reference is now had to FIG. 11 to describe the epitome of a density controlling process in the image forming apparatus. FIG. 11 is a black diagram schematically showing constituents necessary to execute the density controlling process in the image forming apparatus.

In FIG. 11, a control part 1101 controls the whole of the above-described image forming apparatus, and also executes the density controlling process by the utilization of an image forming part 1102, a density sensor 1103 and a density correction table 1104 which will all be described later.

The image forming part 1102 includes the constituents of the image forming apparatus which have been described with reference to FIG. 1. The density sensor 1103 is a sensor for detecting the density of the toners on the transfer material carrying member, etc., and is comprised, for example, of an infrared light emitting element such as an LED, a light receiving element such as a photodiode, and a processing part for processing received light data produced by the light receiving element. The density correction table 1104 is a table for storing therein data for correcting the density value detected by the density sensor 1103.

In this image forming apparatus, the shock band preventing pattern and the forgery discriminating pattern generally use the yellow color, and if the above-mentioned patterns are generally imprinted, they are difficult to see by the human eyes, but density becomes high to a certain degree and particularly, in a high light portion, noise and the yellowishness of the texture become conspicuous. Also, the above-mentioned patterns are singly difficult to see, but will sometimes be visualized if mixed with the other colors by subtractive color mixture. Therefore, even if in order to obtain an optimum quality of image, the above-described image density control is effected to thereby correct image density, the above-mentioned shock band preventing pattern and forgery discriminating pattern overlap the actual toner images over the entire area thereof. Therefore, particularly in the high light portion, a change in density comes to be remarkably seen.

Figure 6:
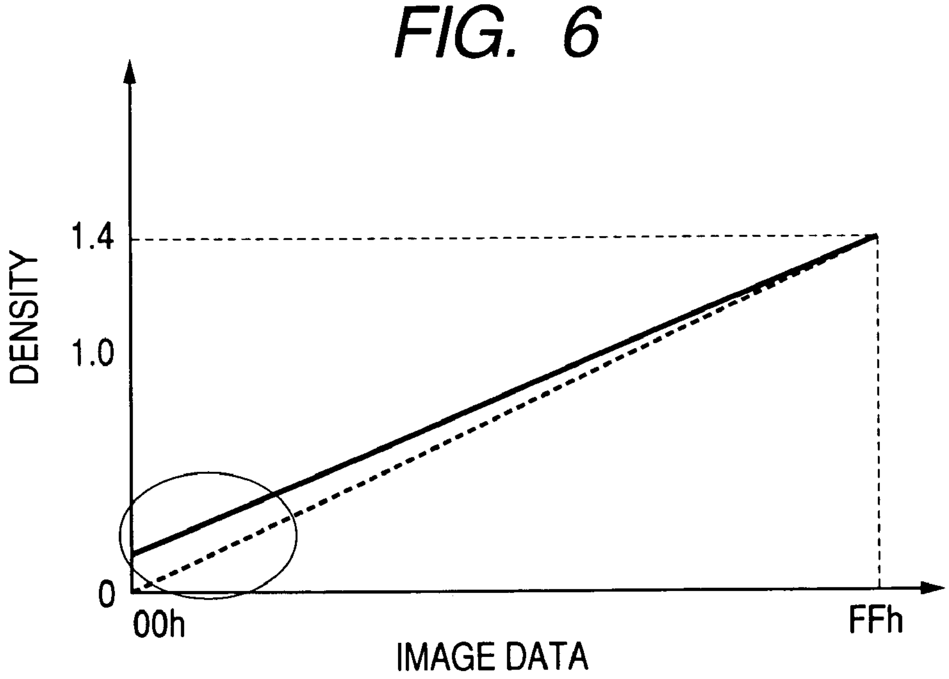
FIG. 6 is a graph showing the relation between density and image data when a pattern is superimposed on a patch for density detection corresponding to a first embodiment of the present invention.

FIG. 6 is a graph showing the relation between the density and image data of the yellow color on the yellow image bearing member or the transfer material carrying member. In FIG. 6, the axis of ordinates indicates the toner density on the image bearing member or the transfer material carrying member, and the axis of abscissas indicates image data (gradation). Also, the solid line indicates the relation between the density and image data when the above-mentioned shock band preventing pattern and forgery discriminating pattern were superimposed on the actual toner image as a result of the conventional density control, and the dotted line indicates the relation between the ideal density and image data when the above-mentioned patterns were not superimposed on the actual toner image.

When the density of the actual toner image is high, the transfer material carrying member is substantially entirely covered with the actual toner. Therefore, there is little or no contribution by the above-mentioned patterns being made to overlap the actual toner image, and the density obtained in this case hardly differs from the density obtained from the result of density control. However, when the toner density is low, that is, in the high light portion, the amount of actual toner adhering to the transfer material carrying member is small and there are many blank areas. Therefore, the contribution of the above-mentioned patterns becomes great and the difference between the result of density control and the density of the actual toner image is remarkably seen.

As described above, by the above-mentioned patterns being added, the density of the actual yellow toner image is changed. As a result, the balance between the yellow color and the other three colors is destroyed and good color balance cannot be obtained, and it becomes impossible to provide an optimum quality of image to the user. Consequently, if the contribution of the above-mentioned patterns can be reflected in density control, any change in the density of the actual toner image can be prevented, and it becomes possible to provide the optimum quality of image.

So, in the image forming apparatus according to the present embodiment, design is made, on the basis of the above-noted recognition, such that the forgery discriminating pattern or the shock band preventing pattern is superimposed only on the yellow patch during density control to thereby eliminate the contribution of the above-mentioned patterns to the toner image, and prevent any change in the density of the actual toner image. This is realized by incorporating the density of the above-mentioned patterns into the image data of the yellow color of an image pattern the user tries to obtain as a final image.

The correction of the result of density control which is a great feature of the present invention will hereinafter be described with reference to FIGS. 7 and 8.

Figure 7:
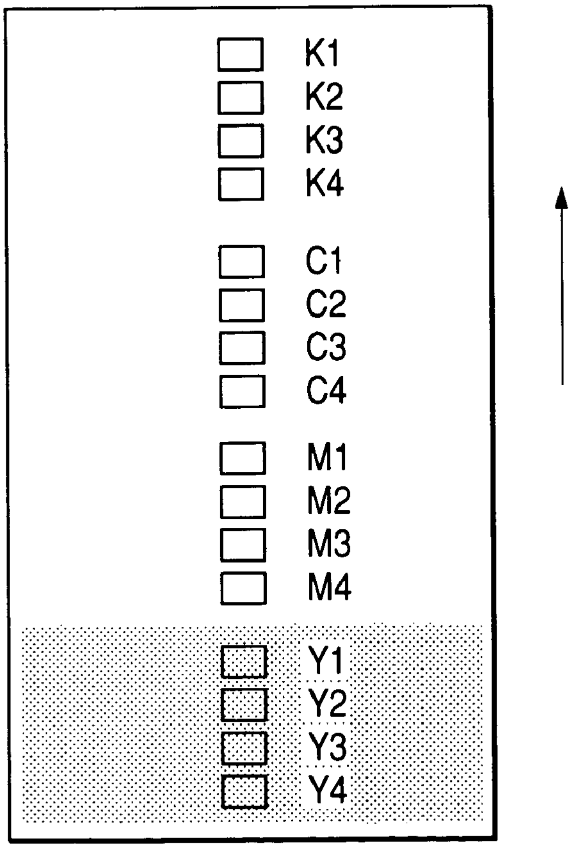
FIG. 7 is a schematic view of the patch for density detection and yellow dots corresponding to the first embodiment of the present invention.

FIG. 7 is a schematic view of a patch for density detection in the above-described present embodiment and the forgery discriminating pattern or the shock band preventing pattern made to overlap the patch. Also, the patch for density detection used in FIG. 7 is similar to that in FIG. 2.

As shown in FIG. 7, the above-mentioned forgery discriminating pattern or shock band preventing pattern is superimposed only on yellow patch portions (Y1-Y4). Also, the arrow in FIG. 7 indicates the direction of movement on the image bearing member on the transfer material carrying member. Such a patch for density detection as shown in FIG. 7 is prepared, and the density of the patch is detected by an optical sensor (density sensor) comprising a light emitting element and a light receiving element. The image forming conditions are adjusted in conformity with the detected density of the patch, whereby the density of the above-mentioned pattern can be incorporated into the yellow image data.

Figure 8:
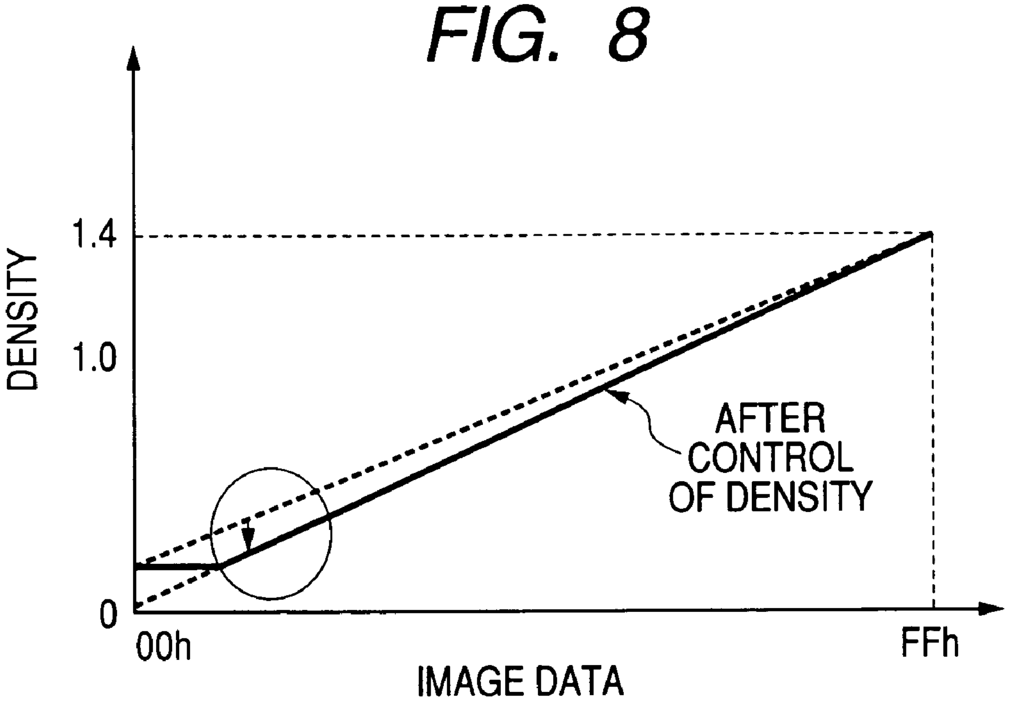
FIG. 8 is a graph showing the relation between the density and image data after density control corresponding to the first embodiment of the present invention.

FIG. 8 is a graph representing the effect by effecting density control by the use of the above-described patch for density detection shown in FIG. 7. Also, for the comparison of the effect of the present invention, a graph showing the relation between the ideal density and image data when the above-mentioned shock band preventing pattern and forgery discriminating pattern were registered on the actual toner image as the result of the conventional density control shown in FIG. 6 is indicated by a dotted line. As in FIG. 6, the axis of ordinates indicates the toner density on the image bearing member or the transfer material carrying member, and the axis of abscissas indicates the image data (gradation).

In FIG. 8, the solid line indicates a graph of the density control effected by the use of the above-described patch for density detection shown in FIG. 7. When the toner density is high, there is little or no contribution by the above-mentioned pattern being made to overlap the actual toner image and therefore, the result obtained in this case hardly differs from the result of the conventional density control. However, when the toner density is low, that is, in the high light portion, the contribution of the above-mentioned pattern can be incorporated, and it is coincident with the ideal density and image data when the above-mentioned patterns are not added. However, as is apparent from FIG. 8, in the higher light portion, it is not coincident with the graph of the foregoing ideal density and image data.

By the addition of the above-mentioned patterns, the density of the yellow toner image can be prevented from being changed to thereby destroy the density balance of the toner images of the four colors.

Description has been made above of the correction of the result of density control in the present embodiment.

A great feature of the present embodiment is that on the basis of the above-noted recognition, the forgery discriminating pattern or the shock band preventing pattern is registered only on the yellow path during density control to thereby eliminate the contribution of the above-mentioned patterns to the toner image. Thereby, even if density control is effected and the image density is corrected, the above mentioned shock band preventing pattern and forgery discriminating pattern are made to overlap the actual toner image over the entire area thereof. Therefore, any change in the density, particularly in the high light portion, can be suppressed, and the optimum quality of image can be provided to the user.

Also, in the present embodiment, description has been made with respect particularly to the yellow color. This is because the yellow color is generally used for the forgery discriminating pattern or the shock band preventing pattern. Of course, an effect similar to that described above is also obtained when the above-mentioned patterns use other color.

Second Embodiment

This embodiment is another example of the aforedescribed first embodiment, and the construction, etc. of the image forming apparatus are similar to those in the first embodiment.

The density controlling method described in the first embodiment has been such that during density control, the forgery discriminating pattern or the shock band preventing pattern is registered only on the yellow patch to thereby eliminate the contribution of the above-mentioned patterns to the actual toner image. The above-mentioned pattern, however, is generally added to the entire image area. Therefore, it is often difficult to control of the image forming apparatus to imprint the above-mentioned pattern only on a particular patch portion for density detection, i.e., to imprint the shock band preventing pattern only on the areas Y1 to Y4 as shown in FIG. 7.

Also, when during density control, the pattern cannot be imprinted only on a predetermined area and the forgery discriminating pattern or the shock band preventing pattern is superimposed on the patches of all colors, the aggravation of density can be prevented with respect to the patch of the same color as the pattern as described in the first embodiment. On the other hand, with respect to the colors other than the color of the pattern, the density of the pattern including the riding amount thereof is detected during density control and, therefore, the detected density level becomes high. In the density control effected on the basis of the result of this detection, control is executed in a direction to lower the density and therefore, the density of the actual toner image obtained as the result of the density control becomes low.

Figure 9:
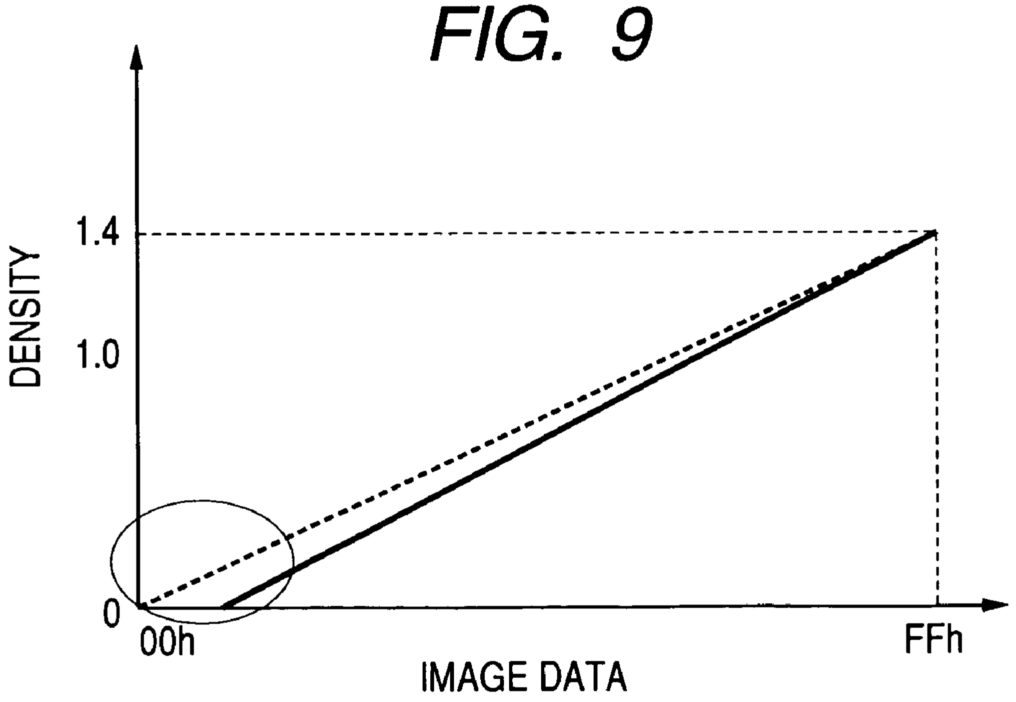
FIG. 9 is a graph showing the relation between the density and image data when density control was effected with a pattern superimposed on a patch for density detection corresponding to a second embodiment of the present invention.

FIG. 9 is a graph showing the relation between the density and image data in a color differing from that of the pattern when, during density control, the shock band preventing pattern and the forgery discriminating pattern are registered in all colors.

In FIG. 9, the axis of ordinates indicates the toner density on the image bearing member or the transfer material carrying member, and the axis of abscissas indicates the image data (gradation). The solid line indicates the relation between the density and image data in a color differing from that of the above-mentioned patterns as a result of density adjustment effected with the above-mentioned superimposed patterns, and the dotted line indicates the relation between the density and image data obtained from the result of ideal density control.

As will be seen from FIG. 9, even if the above-mentioned patterns are added, when the toner density is high, there is little or no influence of the overlapping of the above-mentioned patterns, and there is little or no difference in the result of density control by the difference between the presence and absence of the patterns. However, when the toner density is low, i.e., in the high light portion, the contribution of the above-mentioned patterns becomes great and the influence of the density control as described above is reflected. Therefore, the difference in the toner density obtained from the result of the actual density control and the result of the ideal density control is remarkably seen.

As described above, the density control is executed with the above-mentioned patterns added, whereby the density of the other color toner images than the above-mentioned patterns is aggravated and good color balance cannot be obtained, and it becomes impossible to provide the optimum quality of image to the user. Accordingly, if the contribution of the above-mentioned patterns can be reflected in the density control, the aggravation of the density of the actual toner image can be prevented, and the optimum quality of image can be provided.

So, in the present embodiment, it is to be understood that the forgery discriminating pattern or the shock band preventing pattern is superimposed on all of the yellow, magenta, cyan and black patches during density control, and in each of the magenta, cyan and black colors, the correction of the result of density control taking the riding amount of the pattern into account is effected.

Figure 10:
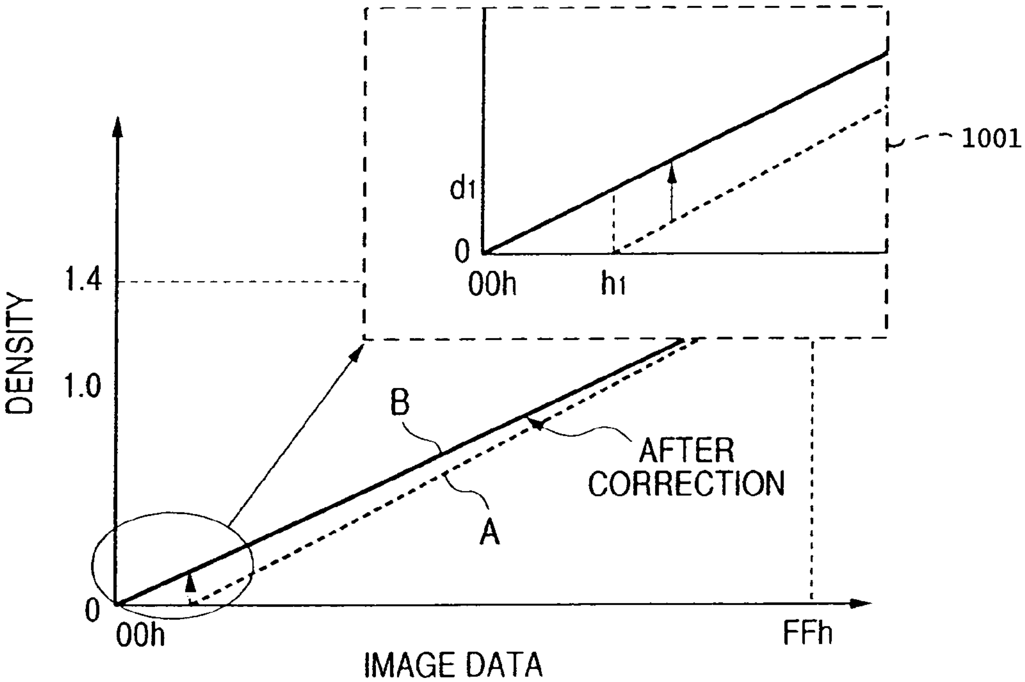
FIG. 10 is a graph showing the relation between the density and image data after the correction of the result of density control corresponding to the second embodiment of the present invention.

The correction of the result of density control which is a great feature of the present invention will hereinafter be described with reference to FIG. 10. The graph indicated by solid line B in FIG. 10 shows the relation between the density and image data obtained when the result of density control was corrected with the riding amount of the pattern taken into account. In FIG. 10, for the confirmation of the effect of the present invention, the relation between the density and image data when the correction of the result of density control was not effected with the riding amount of the pattern shown in FIG. 9 taken into account is indicated by dotted line A. Also, again in FIG. 10, as in FIG. 9, the axis of ordinates indicates the toner density on the image bearing member or the transfer material carrying member, and the axis of abscissas indicates the image data (gradation).

In FIG. 10, a portion of the graph is shown while being enlarged to an area 1001 indicated by dotted line, and this is shown for the purpose of describing the correcting method in the present embodiment. First, h1 indicated in the enlarged graph 1001 of the high light portion is calculated h1 is an image data value (developing bias value) in which the toner density began to become 0 as the result of density control effected on the basis of the density of the toner portion to which the pattern was added, and is an image data value which becomes the density of only the pattern.

Next, the density of the added pattern is calculated. This density was found during the density control of the yellow patch corresponding to the first embodiment and therefore, it may be utilized. The density of this pattern, as shown in the enlarged portion 1001 of FIG. 10, corresponds to the density d1 when the image data is h1 on the solid line B.

The inclination (α) of the straight line B after correction is determined by the above-mentioned two values h1 and d1. This may be expressed as follows by an expression:

$$\alpha = d1/h1$$

By the use of the inclination α found in this manner, the straight line which is the dotted line A can be corrected to the solid line B.

Figure 12:
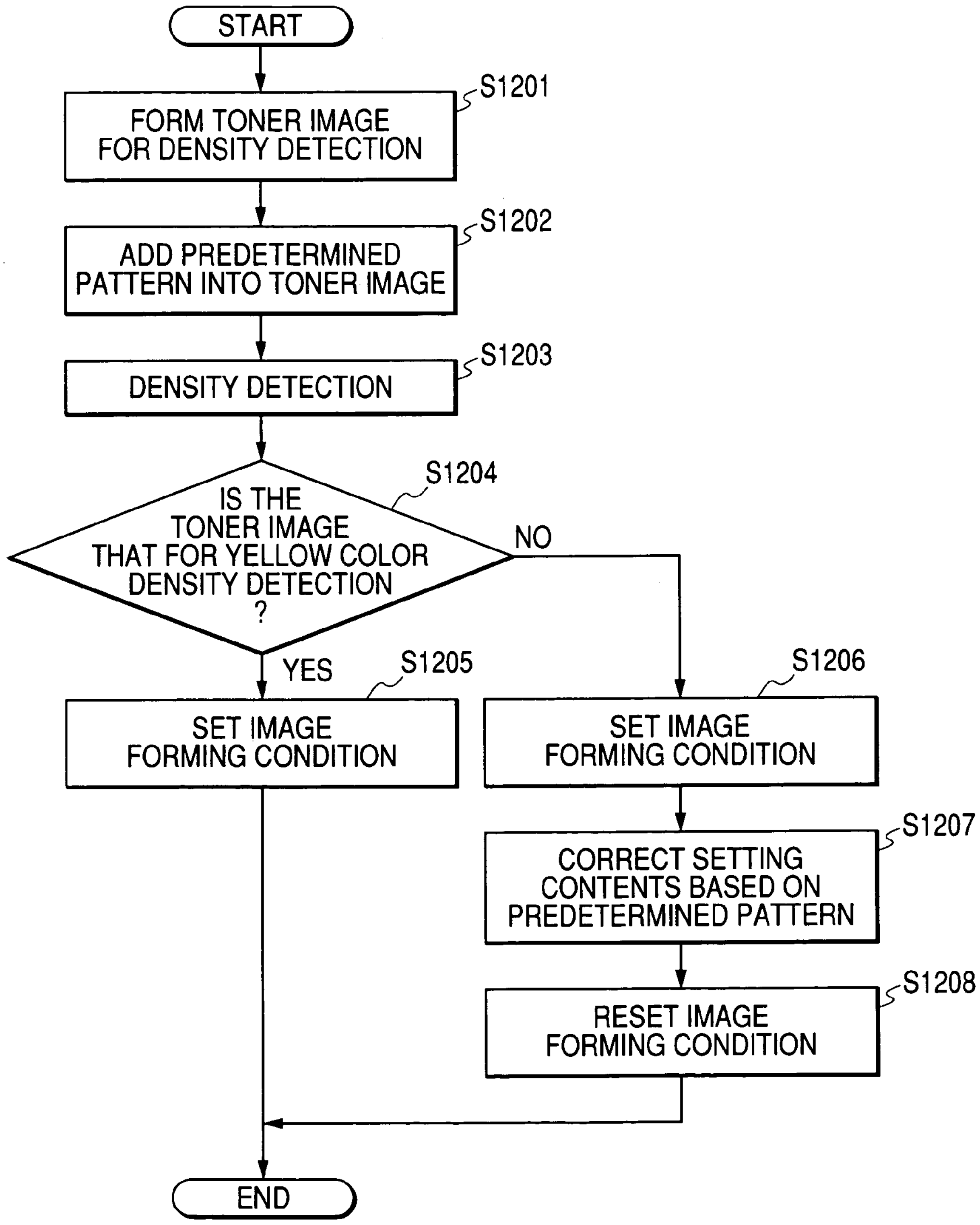
FIG. 12 is a flow chart of a density controlling process corresponding to the second embodiment of the present invention.

The above-described density controlling process in the present embodiment will hereinafter be summed up with reference to a flow chart shown in FIG. 12.

Figure 2:
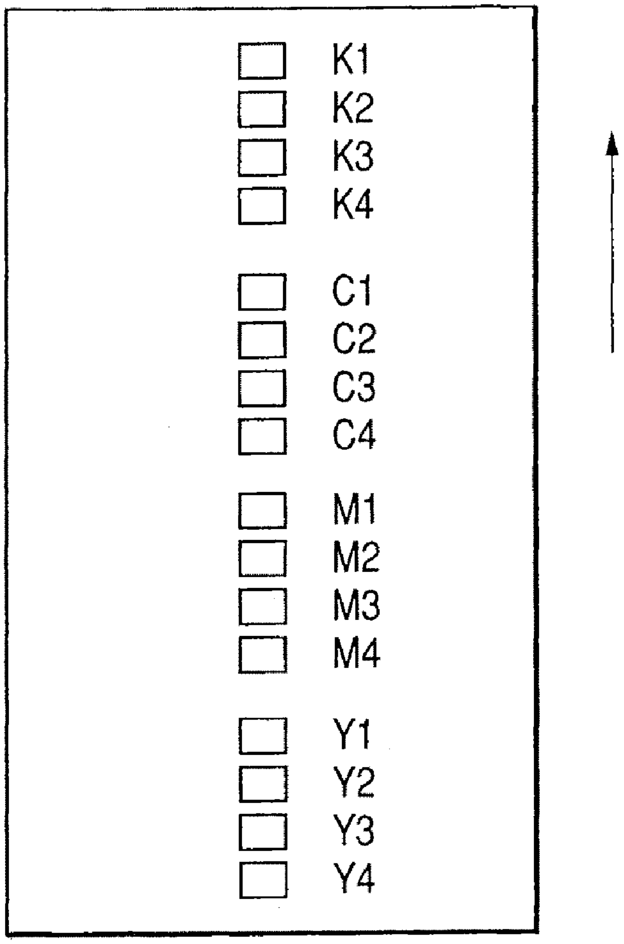
FIG. 2 PRIOR ART
FIG. 2 shows an example of a patch for density detection corresponding to an embodiment of the present invention.
Figure 3:
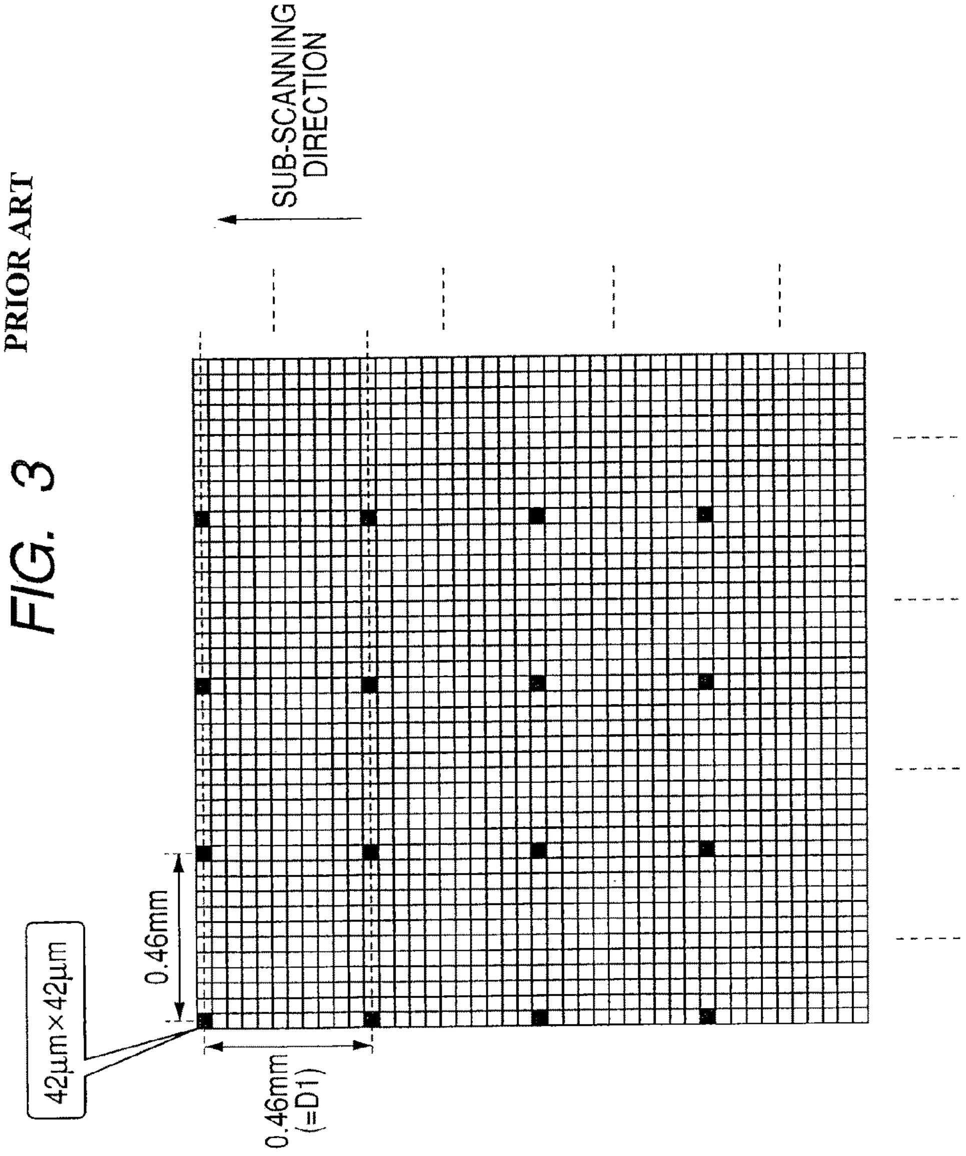
FIG. 3 PRIOR ART
FIG. 3 shows an example of a shock band preventing pattern corresponding to an embodiment of the present invention.
Figure 4:
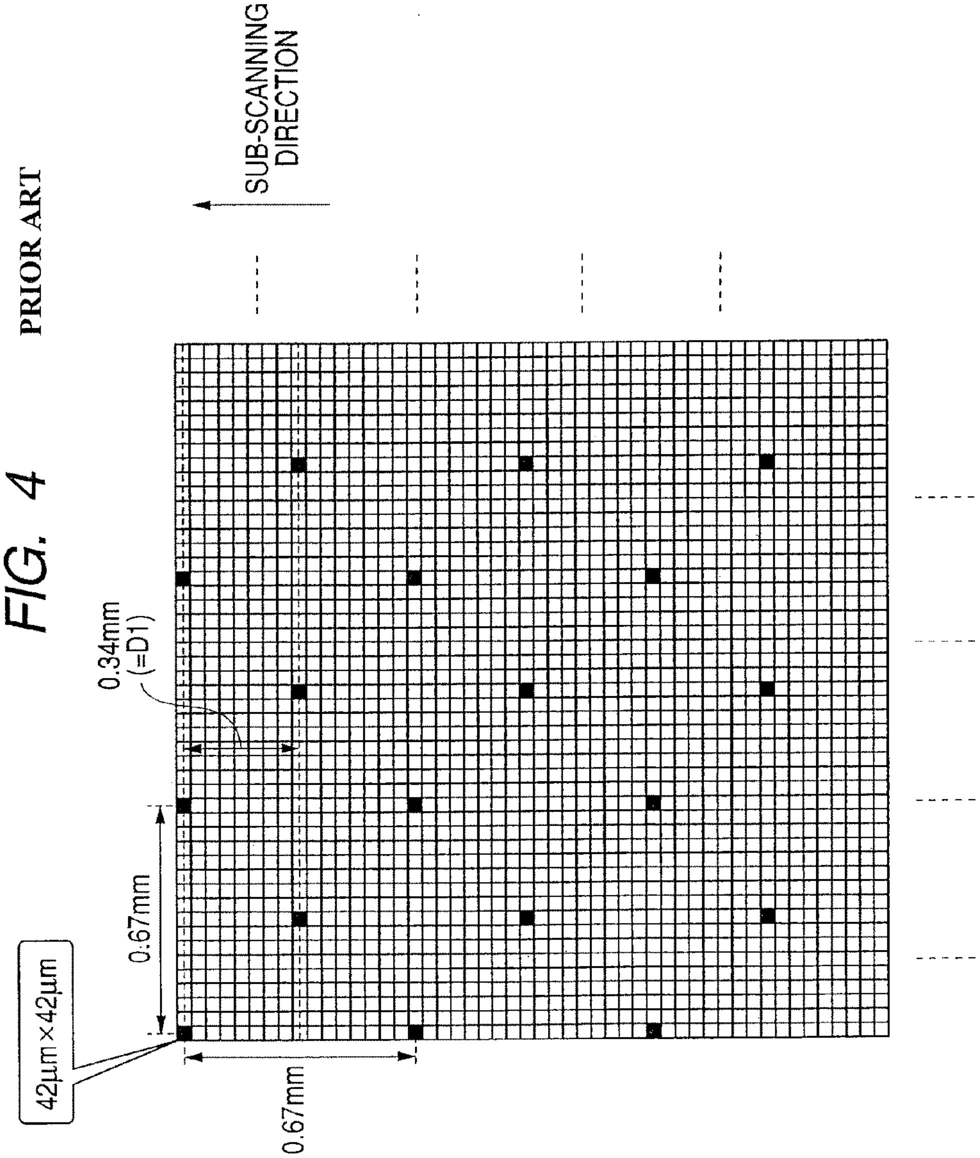
FIG. 4 PRIOR ART
FIG. 4 shows an example of the shock band preventing pattern corresponding to the embodiment of the present invention.
Figure 5:
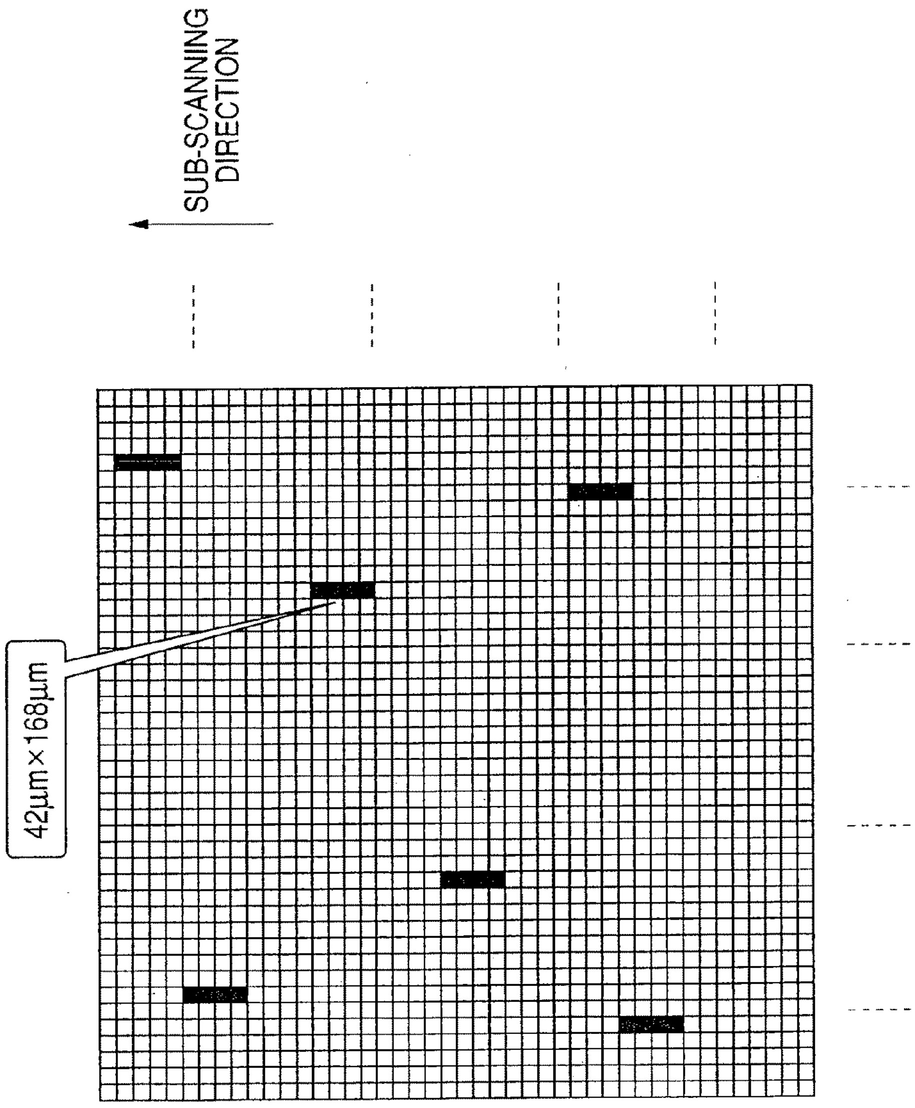
FIG. 5 PRIOR ART
FIG. 5 shows an example of a forgery discriminating pattern corresponding to an embodiment of the present invention.

First, at a step S1201, a toner image for density detection as shown in FIG. 2 is formed. At a step S1202, for the toner image formed at the step S1201, a shock band preventing pattern or a forgery discriminating pattern is formed by the yellow toner. At the subsequent step S1203, the density to which the pattern has been added is detected. At a step S1204, whether the color of the toner for setting the image forming condition is yellow is judged, and if it is yellow, shift is made to a step S1205, where the image forming condition is set on the basis of the density of the toner image detected at the step S1204.

On the other hand, if the color of the toner for setting the image forming condition is not yellow, shift is made to a step S1206, where the image forming condition is first set with respect to the detected density. At a step S1207, the set image forming condition is corrected to a condition taking the density of the pattern into account. Specifically, it is changed into such an image forming condition that in FIG. 10, the toner density after correction is as indicated by the solid line B. The solid line B, as described in the second embodiment, can be determined on the basis of the image data for which the density becomes 0 in the image forming condition set at the step S1206 and the density of the above-mentioned pattern.

At a step S1208, the condition after correction is again set as the image forming condition.

Thereby, even when, during density control, the above-mentioned pattern is added to the patches of all colors for density detection, the above-described correction can be effected to thereby obtain an effect similar to that described in the first embodiment.

Third Embodiment

This embodiment is another example of the aforedescribed first embodiment, and the construction, etc. of the image forming apparatus are similar to those in the first embodiment.

The density controlling method described in the first embodiment has been to register the forgery discriminating pattern or the shock band preventing pattern only on the yellow patch during density control to thereby eliminate the contribution of the above-mentioned pattern to the toner image. The above-mentioned pattern, however, is generally added after the detection of the image data and therefore, it is often the case that it is difficult in the control of the image forming apparatus to imprint the above-mentioned pattern on the patch for density detection.

So, in the present embodiment, the forgery discriminating pattern is not registered on the patch for density detection, but the correction of the result of density adjustment is effected only about the yellow patch. Also, at the same time, the toner consumption amount of the above-mentioned pattern added to the patch for density detection can be suppressed.

The correction of the result of density adjustment concerning the yellow color can be realized by feeding back the predetermined density of the forgery discriminating pattern or the shock band preventing pattern to the result of this density control. That is, such correction is effected as to decrease the density corresponding to the amount of contribution of the above-mentioned pattern to the density at the values 00 h to FFh of the image data from the result of density control when the above-mentioned pattern is not added to the patch for density control (that is, the correction changes the image forming condition with the contribution of the pattern taken into account).

Thereby, even if the conventional density control (the above-mentioned pattern is not added to the patch for density control) is used, the above-described correction of the result of density control is effected, whereby an effect similar to that described in the first embodiment can be obtained.

Also, there is a case where the pattern can be switched ON and OFF by the user, or a case where such setting as changes the pattern to be added or the printing rate can be done by the automatic detection of an image pattern in an image processing unit. Again in such a case, the above-described density correction can be effected in accordance with the printed state of the above-mentioned pattern, whereby the difference in the quality of image depending on the printed state of the above-mentioned pattern can be mitigated, and this also is one of the great features of the present embodiment.

The first to third embodiments of the present invention have been described above. The present invention is not restricted to the constructions described in the above-described first to third embodiments. That is, the density controlling method in the present invention, which takes the density of the forgery discriminating pattern or the shock band preventing pattern into account during density control, is not restricted to the density controlling methods for the image forming apparatuses of the above described first to third embodiments, but is also applicable to all forms of density controlling methods for all forms of image forming apparatuses.

Other Embodiments

The present invention may be applied to any one of a system comprised of a plurality of apparatuses (such as, for example, a host computer, an interface apparatus, a reader and a printer) and a single apparatus (such as, for example, a copying machine or a facsimile apparatus).

Also, of course, the object of the present invention can be achieved by supplying a system or an apparatus with a storing medium (or a recording medium) having recorded therein the program code of software for realizing the functions of the aforedescribed embodiments, and the computer (or the CPU or MPU) of the system or apparatus reading out and executing the program code stored in the storing medium. In this case, the program code itself read out from the storing medium realizes the functions of the aforedescribed embodiments, and the storing medium storing the program code therein constitutes the present invention. Also, of course, the present invention covers a case where by executing the program code read out by the computer, not only the functions of the aforedescribed embodiments are realized, but on the basis of the instructions of the program code, an operating system (OS) or the like working on the computer carries out part or the whole of actual processing, and the functions of the aforedescribed embodiments are realized by that processing.

The present invention, of course, further covers a case where the program code read out from the storing medium is written into a function expanding card inserted in the computer or a memory provided in a function expanding unit connected to the computer. Thereafter, on the basis of the instructions of the program code, the function expanding card or a CPU or the like provided in the function expanding unit carries out part or the whole of actual processing, and the functions of the aforedescribed embodiments are realized by that processing.

While the present invention has been described with respect to several preferred embodiments thereof, the present invention is not restricted to these embodiments, but it is apparent that various modifications and applications are possible within the scope of the invention as defined in the appended claims.

This application claims priority from Japanese Patent Application No. 2003-307184 filed Aug. 29, 2003, which is hereby incorporated by reference herein.

What is claimed is:

1. An image forming apparatus including:

an image forming unit adapted to form images of a plurality of colors to which a forgery discriminating pattern of a yellow color is added, the forgery discriminating pattern having a predetermined arrangement of dot toner images;

a controller configured to control said image forming unit so as to form patch images, each of which is composed of a single color of the plurality of colors including yellow, magenta, cyan, and black, for density detection;

a detector configured to detect a density of each of the patch images; and an adjusting unit for adjusting an image forming condition, wherein said controller controls said image forming unit so as to add the forgery discriminating pattern of the yellow color to all of the patch images, wherein said adjusting unit adjusts an image forming condition of the yellow color on the basis of a density of the patch image of the yellow color detected by said detector, and said adjusting unit adjusts an image forming condition of colors other than the yellow color on the basis of both the density of the patch image of the respective color other than the yellow color detected by said detector and a density of the forgery discriminating pattern of the yellow color, and wherein if (i) a first correspondence line indicates a relationship between gradation values and density values, obtained in a case where density control is executed based on the density of each of the patch images other than the yellow color detected by said detector without consideration of the density of the forgery discriminating pattern of the yellow color, in which said adjusting unit adjusts the image forming condition of colors other than the yellow color such that the densities are lighter than the ideal densities of the colors other than the yellow color, and (ii) a second correspondence line indicates a relationship between gradation values and density values, obtained in a case where density control is executed based on the density of each of the patch images other than the yellow color detected by said detector with consideration of the density of the forgery discriminating pattern of the yellow color, said adjusting unit adjusts the image forming condition of the colors other than the yellow color in a manner where a difference between the first correspondence line and the second correspondence line at a low-density portion is larger than the difference between the first correspondence line and the second correspondence line at a high-density portion.

2. An image forming apparatus according to claim 1, wherein said adjusting unit adjusts a density correction table.

3. A controlling method for an image forming apparatus for forming images of a plurality of colors to which a forgery discriminating pattern of a yellow color is added, the forgery discriminating pattern having a predetermined arrangement of dot toner images, said controlling method comprising:

a step of controlling an image forming unit so as to form a patch images, each of which is composed of a single color of the plurality of colors including yellow, magenta, cyan, and black, for density detection;

a step of detecting a density of each of the patch images; and a step of adjusting an image forming condition, wherein in said step of controlling an image forming unit, the image forming unit is controlled so that the forgery discriminating pattern of the yellow color is added to all of the patch images, wherein in said step of adjusting an image forming condition, an image forming condition of the yellow color is adjusted on the basis of a density of the patch image of the yellow color detected by said step of detecting, and in said step of adjusting an image forming condition of colors other than the yellow color is adjusted on the basis of both the density of the patch image of the respective color other than the yellow color detected in said step of detecting the density and a density of the forgery discrimination pattern of the yellow color, and wherein if (i) a first correspondence line indicates a relationship between gradation values and density values, obtained in a case where density control is executed based on the density of each of the patch images other than the yellow color detected by said step of detecting without consideration of the density of the forgery discriminating pattern of the yellow color, in which said step of adjusting adjusts the image forming condition of colors other than the yellow color such that the densities are lighter than the ideal densities of the colors other than the yellow color, and (ii) a second correspondence line indicates a relationship between gradation values and density values, obtained in a case where density control is executed based on the density of each of the patch images other than the yellow color detected by said step of detecting with consideration of the density of the forgery discriminating pattern of the yellow color, said step of adjusting adjusts the image forming condition of the colors other than the yellow color in a manner where a difference between the first correspondence line and the second correspondence line at a low-density portion is larger than the difference between the first correspondence line and the second correspondence line at a high-density portion.

4. A controlling method according to claim 3, wherein the image forming condition includes a density correction table.

* * * * *